United States Patent [19]

Watanabe et al.

[11] 4,433,588
[45] Feb. 28, 1984

[54] CLUTCH MECHANISM

[75] Inventors: Tadaaki Watanabe; Yoshio Tanaka, both of Saitama, Japan

[73] Assignee: Clarion Co., Ltd., Tokyo, Japan

[21] Appl. No.: 286,922

[22] Filed: Jul. 27, 1981

[30] Foreign Application Priority Data

| Jul. 28, 1980 | [JP] | Japan | 55-105597[U] |
| Jul. 28, 1980 | [JP] | Japan | 55-105596[U] |
| Aug. 1, 1980 | [JP] | Japan | 55-108283[U] |
| Aug. 4, 1980 | [JP] | Japan | 55-109813[U] |
| Aug. 8, 1980 | [JP] | Japan | 55-111722[U] |

[51] Int. Cl.³ .................. H03J 5/12; G05G 1/02; F16H 55/18
[52] U.S. Cl. ................ 74/10.33; 74/10.27; 74/10.8; 74/206; 74/440; 334/7
[58] Field of Search .............. 74/10.27, 10.33, 10.37, 74/10.8, 206, 440; 334/7

[56] References Cited

U.S. PATENT DOCUMENTS

| 1,854,608 | 4/1932 | Burger | 74/440 |
| 2,953,927 | 9/1960 | Race | 74/10.27 |
| 3,722,298 | 3/1973 | Tennerstedt | 74/10.8 |

*Primary Examiner*—Allan D. Herrmann
*Attorney, Agent, or Firm*—Flynn, Thiel, Boutell & Tanis

[57] ABSTRACT

A bearing mechanism for clutch shaft, in which a U-shaped fork bracket is secured to the frame side face of a pushbutton-operated tuner, of the right and left arms of said U-shaped fork bracket, to the one on the frame side being formed a V-shaped bearing hole, the portion of clutch shaft on the frame side being received in said V-shaped bearing hole; a circular bearing hole being formed in the opposite arm of said fork bracket, the tapered portion formed on the other end portion of the clutch shaft being fitted in said circular bearing hole.

6 Claims, 9 Drawing Figures

CLUTCH MECHANISM

BACKGROUND OF THE INVENTION

The present invention relates to a clutch mechanism for use in a pushbutton-operated tuner.

DESCRIPTION OF THE PRIOR ART

Pushbutton-operated tuners are well-known which are provided with a plurality of pushbuttons. By depressing any one of the pushbuttons, a crank is made to pivot and a core coupled to the crank is thus made to move in and out of a coil, thereby effecting tuning. The crank is also connected to a tuning knob. By turning this tuning knob, a desired frequency is set for each of the pushbuttons. If the crank remains coupled to the tuning knob at the time of pushbutton operation, however, the load to the pushbutton is so big that the button cannot be smoothly and easily operated. To avoid this, a clutch mechanism is provided between the crank and the tuning knob. In order to operate any one of the pushbuttons, the clutch is disengaged to reduce the load to the button.

A clutch mechanism is known which comprises, as shown in FIG. 1, a sleeve 2 fixed to a tuner frame 1 by calking, and a clutch shaft 3 inserted in the sleeve 2; one end of the clutch shaft 3 (the end inside the frame 1) has fixed thereto a gear 4 which is interlocked with a pivoting crank (not shown), the other end having fixed thereto a clutch disk 5. Further, a sleeve 6 is freely slidable on the outer circumference of the clutch shaft 3. To this sliding sleeve 6 are mounted a crown gear 7 interlocked with the tuning knob and a clutch lever 8. In these conventional clutch mechanisms, however, there is provided a compressed spring 9 between the frame 1 and clutch lever 8 (sliding sleeve 6) to force the crown gear 7 against the clutch disk 5, thereby transmitting the turning force applied to the tuning knob to the crank; when no turning force is transmitted (when tuning to a station by operating the corresponding pushbutton), the sliding sleeve 6 is moved against the action of the spring 9 by means of the clutch lever 8 interlocked with the pushbutton, thus disengaging the crown gear 7 from the clutch disk 5.

However, such prior-art clutch mechansims must include as an essential part the sleeve 2 for supporting the clutch shaft 3; consequently, they comprise a thus-increased number of parts, and are complicated in construction. Particularly, in order to fix this sleeve 2 to the frame 1, very troublesome work such as calking is essential. Further, in these prior-art clutch mechanisms, since the sleeve 2 is fixed like a cantilever to the frame 1, the sleeve is apt to be installed at an incorrect angle at the time of assembling. Thus, with the conventional techniques, it is difficult to obtain high-precision products.

SUMMARY OF THE INVENTION

Accordingly, the present invention has a primary object to overcome the above-mentioned drawbacks of the conventional clutch mechanisms, by providing a bearing mechanism in which a fork bracket having a U shape is secured to the side face of a frame to support a clutch gear with both the right and left arms of the fork bracket, thus positively supporting a clutch shaft without using any sleeve.

The foregoing and other objects and advantages of the present invention will be better understood from the ensuing description made, by way of example, of one preferred embodiment of clutch mechanism according to the present invention.

DETAILED EXPLANATION OF THE PREFERRED EMBODIMENTS

Figure 1:
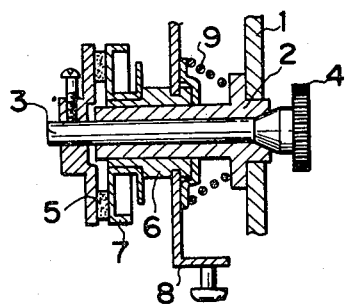
FIG. 1 is a sectional view of a typical conventional clutch mechanism.
Figure 2:
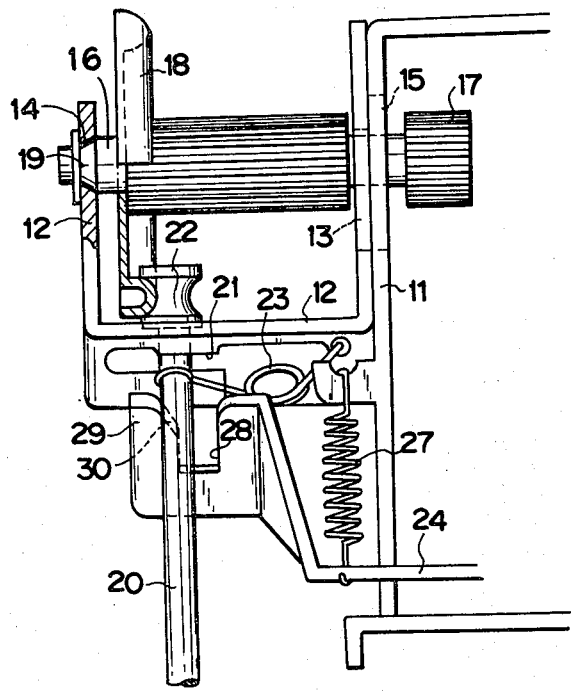
FIG. 2 is a plan view of a clutch mechanism according to the present invention.
Figure 3:
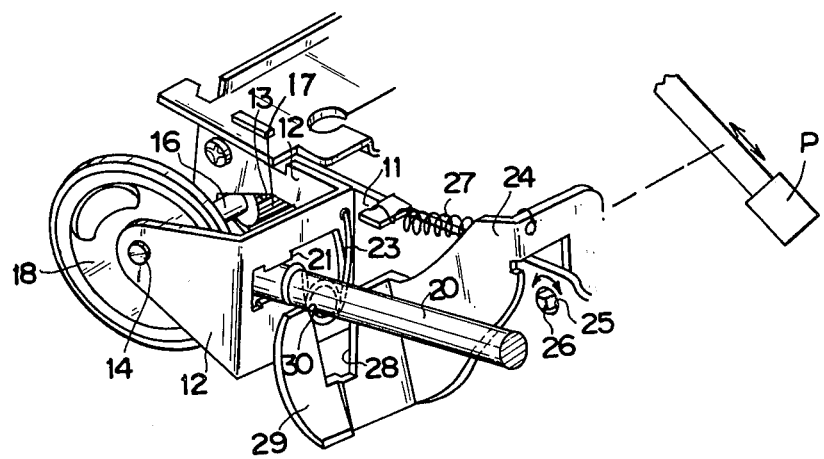
FIG. 3 is a perspective view of the clutch mechanism in FIG. 2.

Referring to FIGS. 2 and 3, the reference numeral 11 denotes a frame of a pushbutton-operated tuner and 12 denotes an integrally formed U-shaped fork bracket. This fork bracket 12 is fixed by screws in one arm thereof to the side face of the frame 11. There is formed in the inner leg of the U-shaped fork bracket 12 that is adjacent to frame 11 a bearing hole 13 one end of which is tapered in the form of the letter V; in the opposite outer leg of the bracket 12 is formed a bearing hole 14 in the form of a circle. Further, there is formed in the side face of the frame 11 a hole 15 face to face with the bearing hole 13 and which receives a large clutch shaft.

Figure 8:
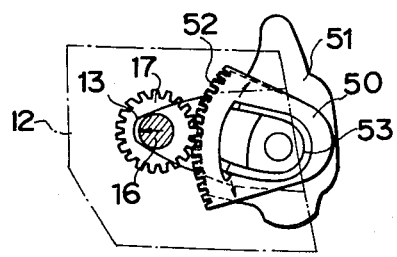
FIG. 8 is a detailed view of the bearing mechanism according to the present invention.
Figure 9:
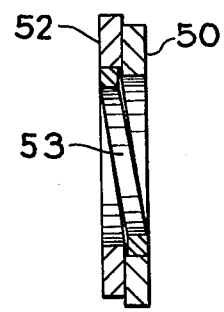
FIG. 9 is a detailed view of the sector gears and spring used therein.

The reference numeral 16 denotes a clutch shaft to the end of which on the frame side is fixed a clutch gear 17, there being fixed a clutch disk 18 to the other end. The clutch shaft 16 is supported by the two legs of said fork bracket 12; namely, the clutch shaft 16 is received at the portion thereof near the clutch gear 17 in the V-shaped bearing hole 13 in the fork bracket 12. In this case, as shown in FIG. 8, the clutch shaft 16 is forced to the tapered or constricted portion (end of V shape) of the V-shaped bearing hole 13 by a sector gear 50 on a pivoting crank 51 in mesh with the clutch gear 17 (or by a separately-provided spring or the like) to prevent the clutch shaft 16 from wobbling within the V-shaped bearing hole 13. More particularly, there is provided by the side of the sector gear 50 on the pivoting crank 51 an auxiliary sector gear 52 rotatably installed to the sector gear 50, as shown in FIG. 8; further, a spring 53, as shown in FIGS. 8 and 9, is provided between these sector gears 50 and 52. This spring 53 provides a force which staggers the tooth tops of the sector gears 50 and 52 from each other; as the result, the clutch gear 17 is elastically pinched at the teeth thereof by the tooth tops of the sector gears 50 and 52 so as to prevent any backlash between the clutch gear 17 and the sector gears 50 and 52. The pinching force of the tooth tops of these sector gears 50 and 52 acts to force the teeth of the clutch gear 17 out from between the tooth tops of the sector gears 50 and 52. Accordingly, the clutch shaft 16 is forced to the tapered or constricted portion of the V-shaped bearing hole 13 as it is pressed by both the sector gears 50 and 52. On the other hand, the opposite end of the clutch shaft 16 is supported in the circular bearing hole 14 formed in the opposite arm of the fork bracket 12. The clutch shaft 16 has a tapered portion 19 which is partially fitted into the bearing hole 14 and serves as a tapered bearing.

The reference numeral 20 denotes a tuning shaft of which the base portion is coupled with a tuning knob by means of a universal joint (not shown). The free end of the tuning shaft 20 is introduced into the bracket 12 through a bearing hole 21 in the front face of the U-shaped fork bracket. There is fixed to the end of the tuning shaft a drum-shaped friction member 22 made of polyurethane elastomer, synthetic rubber or a plastic material; the end of the tuning shaft is in contact with the clutch disk 18 by means of the friction member 22. The tuning shaft 20 is laterally movably supported at the bottom of the bearing hole 21 in the front face of the bracket 12. Further, there is provided on the front face of the bracket 12 a coil spring 23 of which the one end abuts on the bracket 12 while the other end abuts on the tuning shaft 20. The coil spring 23 forces the tuning shaft 20 against the clutch disk 18. When the clutch disk 18 is thus urged by the spring 23, the clutch shaft 16 is urged toward the circular bearing hole 14 in the fork bracket 12 so that the tapered portion 19 is closely fitted in the circular bearing hole 14 with no clearance between them.

Figure 4:
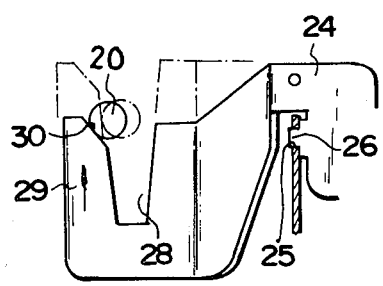
FIG. 4 is a front view of the end of the kick arm.
Figure 5:
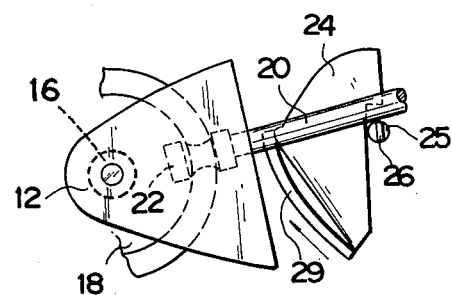
FIG. 5 is a side elevation of the kick arm end.

There is disposed on the inner front face side of the frame 11 a kick arm 24 which is installed to the frame 11 by inserting the fulcrum portion 26 into a bearing hole 26 in the frame 11. A portion of known station-selector button (not shown) abuts on the portion of the kick arm 24 inside the frame 11; when the pushbutton is depressed, the kick arm 24 will pivot to and fro around the fulcrum 26. A coil spring 27 is disposed extending between the upper portion of the kick arm 24 and the frame 11, and acts to return to the initial state the kick arm 24 that has been pivoted by depressing the pushbutton. In the end of the kick arm 24 there are formed as U-shaped recess 28 of such as size that the tuning shaft 20 can enter the recess, as shown in FIG. 4, and a tongue piece 29 for engaging on the outside of the tuning shaft 20. The tongue piece 29 has formed on the end thereof a tapered portion 30 along which the tuning shaft 20 slides; the tongue piece 29 should preferably be curved as a whole so that it lies in the circular arc around the fulcrum 25 as shown in FIG. 5.

The clutch mechanism adopting the bearing mechanism according to the present invention has a construction as mentioned above, and functions as follows:

First, when selecting a station by turning the tuning knob, the kick arm 24 will not pivot. The tuning shaft 20 is not moved by the kick arm 24. Accordingly, the tuning shaft 20 is pressed by the torsion coil spring 23 so that the friction member 22 at the end of the shaft is forced against the clutch disk 18. By turning the tuning knob, the turning force is transmitted to the tuning shaft 20, friction member 22, clutch disk 18 and clutch shaft 16 in this order, thus the clutch gear 17 is rotated. As the result, the sector gear in mesh with the clutch gear and consequently the pivoting crank is pivoted so that the core moves in and out of the coil.

On the contrary, when selecting a station by pushing any of the pushbuttons, when a pushbutton P is depressed, the kick arm 24 is depressed by the button and pivots around the fulcrum 26. Then, also the tongue piece 29 formed at the end of the kick arm 24 will go up. Since the tuning shaft 20 engages on the end of the tongue piece 29, the tuning shaft 20 moves along the tapered portion 30 of the tongue piece 29 and enters the U-shaped recess 28. As a result, the tuning shaft 20 moves against the force of the torsion coil spring 23 in the lateral direction along the lower side of the bearing hole 21 in the front face of the U-shaped bracket 12. The end of the tuning shaft 20 is disengaged from the clutch disk 18. Accordingly, the clutch disk 18, clutch shaft 16 and clutch gear 17 can rotate independently of the tuning shaft 20. Thus when the core moves in and out of the coil under the action of the pivoting crank as depressed by the pushbutton, the turning force to the pivoting crank will not be conveyed to the tuning knob.

As having been described in the foregoing, the bearing mechanism according to the present invention is such that the clutch shaft is supported by the two arms of the U-shaped fork bracket fixed to the side face of the frame. Accordingly, the sleeve for supporting the clutch shaft in the conventional mechanisms is not necessary any longer, which leads to the minimization of the number of parts and to simplification of the assembling process. Further, according to the present invention, the clutch shaft is more securely supported by the two arms and can be assembled with a higher precision. More particularly, the one end of the clutch shaft is supported by the tapered bearing while the other end is by the V-shaped bearing, thus the clutch shaft can be free of wobbling.

Further, in case the bearing mechanism according to the present invention is used for a clutch of which the tuning shaft is moved as illustrated, a bearing hole formed in the front face of the fork bracket for the tuning shaft can serve both the clutch shaft and tuning shaft.

Figure 6:
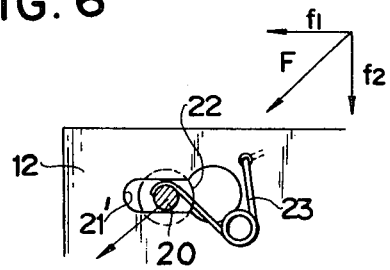
FIG. 6 is a front view of a torsion coil spring fixation.

Further, in the present invention, the torsion coil spring 23 which forces the tuning shaft 20 is provided as shown in FIG. 6. This spring 23 is disposed as compressed between the U-shaped bracket 12 and the tuning shaft 20 so that the force F of the spring 23 will be decomposed to a clutch engaging load $f_1$ to force the tuning shaft 20 horizontally to the clutch disk, and a wobble preventive load $f_2$ to force the tuning shaft 20 vertically toward the bottom side of the bearing 21' provided in the U-shaped bracket. With this construction, a single spring 23 serves to force the tuning shaft 20 to the clutch disk 18 and at the same time to the bottom side of the bearing 21' in the U-shaped bracket 12; so both the purposes of transmitting the turning force from the tuning shaft to the clutch disk and of preventing the tuning shaft from wobbling can be attained at one time.

Figure 7:
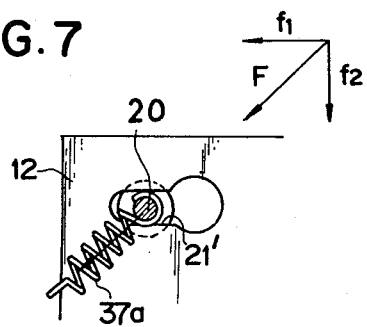
FIG. 7 is a variation of the spring fixation in FIG. 6.

It should be noted that the spring forcing the tuning shaft 20 is not limited to the torsion coil spring shown in FIG. 6, and that it may be a coil spring 37a as shown in FIG. 7. In this case, the coil spring 37a should be installed obliquely for the attracting force F to be decomposed to a clutch engaging load $f_1$ and to a wobbling preventive load $f_2$.

We claim:

1. In a pushbutton-operated tuner having a frame, pushbutton means for effecting preset tuning of said tuner, a tuning shaft for effecting manual turning of said tuner and a clutch mechanism for disconnecting said tuning shaft when said pushbutton means is actuated for effecting preset tuning of said tuner, the improvement which comprises: said clutch mechanism comprises a clutch shaft, said clutch shaft having a tapered portion adjacent to the outer end thereof; a substantially U-shaped support member having an inner leg located adjacent to and mounted on said frame, said inner leg of said support member having a substantially V-shaped bearing hole therethrough, said support member having an outer leg located opposite to said inner leg and having an axially tapered circular bearing hole therethrough, said clutch shaft being supported by said support member with said tapered portion of said clutch shaft being fitted in said circular bearing hole and the inner end portion of said clutch shaft extending through said V-shaped bearing hole; a clutch gear mounted on said inner end of said clutch shaft; a clutch disk mounted on said clutch shaft close to the outer end thereof, said tuning shaft being disposed close to said clutch disk and being supported for movement between a first position in which it engages said clutch disk and a second position in which it is disengaged from said clutch disk; a spring member urging said tuning shaft toward said first position; a kick arm member movable in response to operation of said pushbutton means; and a disengaging member responsive to the movement of said kick arm member and coupled to move said tuning shaft to said second position.

2. A clutch mechanism as set forth in claim 1, in which an elongated bearing hole for said tuning shaft is formed in said U-shaped support member, said spring member being disposed between said U-shaped support member and said tuning shaft so as to force said tuning shaft horizontally and vertically in said bearing hole.

3. A clutch mechanism as set forth in claim 1, in which said disengaging member comprises a tongue piece formed at a portion of said kick arm.

4. A clutch mechanism as set forth in claim 1, comprising a backlash preventive gear and an auxiliary gear in mesh with said clutch gear, and a spring disposed between these gears.

5. A pushbutton tuner as claimed in claim 1 in which said tuning shaft is disposed to engage the axially inner side of said clutch disk and said spring member urges said tuning shaft in an axially outward direction so that in said first position of said tuning shaft said clutch disk is urged axially outwardly and thereby said tapered portion of said clutch shaft is urged into said circular bearing hole.

6. In a pushbutton-operated tuner having a frame, pushbutton means for effecting preset tuning of said tuner, a tuning shaft for effecting manual tuning of said tuner and a clutch mechanism for disconnecting said tuning shaft when said pushbutton means is actuated for effecting preset tuning of said tuner, the improvement which comprises: said clutch mechanism comprises a clutch shaft, said clutch shaft having a tapered portion adjacent to the outer end therof; a substantially U-shaped support member having an inner leg located adjacent to and mounted on said frame, said inner leg of said support member having a substantially V-shaped bearing hole therethrough extending in the lengthwise direction of said inner leg, said support member having an outer leg extending parallel with and located opposite to said inner leg and having an axially tapered circular bearing hole therethrough, said clutch shaft extending substantially perpendicular to said legs and being supported by said support member with said tapered portion of said clutch shaft being fitted in said circular bearing hole and the inner end portion of said clutch shaft extending through said V-shaped bearing hole, said support member having a base wall extending between corresponding ends of said legs and substantially perpendicular thereto and parallel with said clutch shaft, said base wall having an elongated bearing hole therethrough; a clutch gear mounted on said inner end of said clutch shaft inside said frame; a clutch disk mounted on said clutch shaft between said legs; said tuning shaft extending perpendicularly to said base wall and through said elongated bearing hole, a friction member mounted on said tuning shaft and adapted to drivingly engage said clutch disk, said tuning shaft being movable in said elongated bearing hole for movement between a first position in which said friction member drivingly engages said clutch disk and a second position in which it is disengaged from said clutch disk; a spring member resiliently urging said tuning shaft toward said first position a pivotally mounted kick arm member movable in response to operation of said pushbutton means; and a disengaging member connected for pivotal movement with said kick arm member and having a guide surface engaging said tuning shaft so that pivotal movement of said kick arm moves said tuning shaft to said second position.

* * * * *

UNITED STATES PATENT AND TRADEMARK OFFICE
CERTIFICATE OF CORRECTION

PATENT NO. : 4,433,588

DATED : February 28, 1984

INVENTOR(S) : Tadaaki Watanabe et al

It is certified that error appears in the above-identified patent and that said Letters Patent is hereby corrected as shown below:

Column 5, line 29; change "claim 1" to ---claim 2---.

Column 6, line 7; change "therof" to ---thereof---.

Column 6, line 38; after "position" insert a semi-colon (;)---.

Signed and Sealed this

Twenty-first Day of August 1984

[SEAL]

Attest:

Attesting Officer

GERALD J. MOSSINGHOFF

Commissioner of Patents and Trademarks